(12) United States Patent
Ho et al.

(10) Patent No.: US 7,948,096 B2
(45) Date of Patent: May 24, 2011

(54) SEMICONDUCTOR USING SPECIFIC CONTACT ANGLE FOR IMMERSION LITHOGRAPHY

(75) Inventors: Bang-Ching Ho, Hsin-Chu (TW); Jen-Chieh Shih, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 222 days.

(21) Appl. No.: 11/408,472

(22) Filed: Apr. 21, 2006

(65) Prior Publication Data

US 2006/0189172 A1 Aug. 24, 2006

Related U.S. Application Data

(62) Division of application No. 10/994,500, filed on Nov. 22, 2004, now Pat. No. 7,119,035.

(51) Int. Cl.
*H01L 23/58* (2006.01)
(52) U.S. Cl. ....................... 257/798; 438/800
(58) Field of Classification Search .............. 257/200; 355/53
See application file for complete search history.

(56) References Cited

U.S. PATENT DOCUMENTS

| | | | |
|---|---|---|---|
| 5,908,705 A | 6/1999 | Nguyen et al. | |
| 6,665,127 B2 | 12/2003 | Bao et al. | |
| 7,033,732 B2 | 4/2006 | Lee | |
| 2004/0125351 A1* | 7/2004 | Krautschik | 355/53 |
| 2005/0042554 A1* | 2/2005 | Dierichs et al. | 430/322 |
| 2005/0106494 A1* | 5/2005 | Huang et al. | 430/270.1 |
| 2005/0175776 A1* | 8/2005 | Streefkerk et al. | 427/256 |
| 2006/0087630 A1* | 4/2006 | Kemper et al. | 355/30 |
| 2009/0020417 A1* | 1/2009 | Kim et al. | 204/192.25 |

FOREIGN PATENT DOCUMENTS

WO WO 2004/074937 9/2004

OTHER PUBLICATIONS

Lee, Duck-Jung, et al., "Effects of a Hydrophilic Surface in Anodic Bonding", Oct. 4, 2004, 1 page, www.iop.org/EJ/abstract/0960-1317/9/4/305, Journal of Micromechanics and Microengineering.
Bin Zhao, Jeffrey S. Moore and David J. Beebe; "Principles of Surface-Directed Liquid Flow in Microfluidic Channels;" Aug. 15, 2002; p. 4259-p. 4268; Analytical Chemistry; vol. 74; No. 16; XP-001132039; 1030479; American Chemical Society.
Atsushi Otake, Emi Araya, Hikaru Momose, Ryuichi Ansai, Masayuki Tooyama and Tadayuki Fukiwara; "Design and Development of Novel Monomers and Copolymers for 1993-nm Lithography;"2004; p. 591-598; Advances in Resist Technology and Processing XXI, XP-002591220; 1030479; Proceedings of SPIE vol. 5376; Yokohama, Japan.
Netherlands Search Report, Application No. 1030479, Filed on Nov. 21, 2005, 5 Pages.
Dutch Patent Office, Extended Search Report mailed Feb. 11, 2011, Application No. NO137537, 13 pages.
Mitsuru Sato et al, TOK Resist & Material Development Status for Immersion Lithography, Litho Forum, Sematech, US, Jan. 27, 2004, bladzijden 1-20,.

* cited by examiner

*Primary Examiner* — Thanh V Pham
*Assistant Examiner* — Tony Tran
(74) *Attorney, Agent, or Firm* — Haynes and Boone, LLP

(57) ABSTRACT

A semiconductor device having a specific contact angle for immersion lithography is disclosed. The semiconductor device includes a substrate and a top layer disposed on the substrate. The top layer used in an immersion lithography process includes a composition such that a fluid droplet that occurs during the immersion lithographic process and is not part of an exposure fluid puddle, will have a contact angle between about 40° and about 80° with a surface of the top layer.

16 Claims, 3 Drawing Sheets

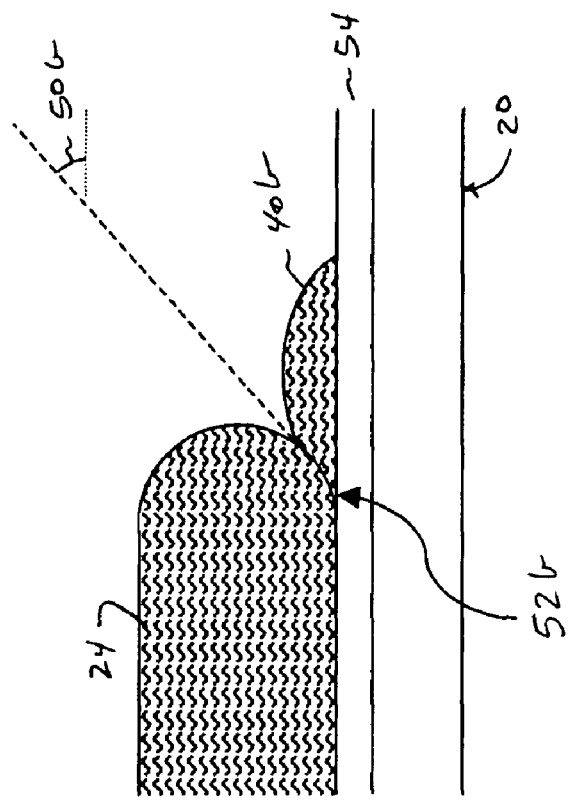
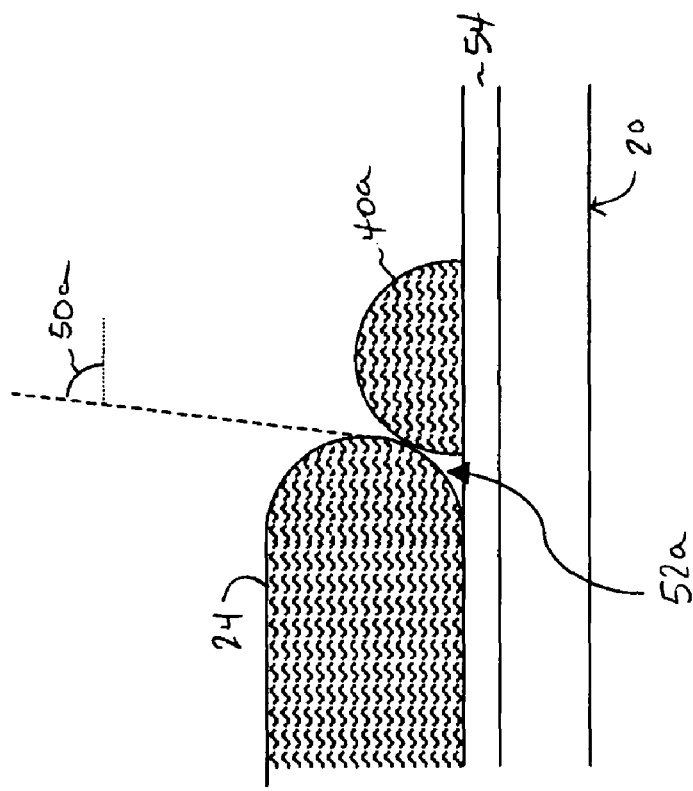
Fig. 4
Fig. 3 ated circuits have generally followed the two year/half-size rule (often called Moore's Law), which means that the number of devices on a chip doubles every two years. Today's fabrication plants are routinely producing devices having 0.13 micron and even 90 nm feature sizes.

SEMICONDUCTOR USING SPECIFIC CONTACT ANGLE FOR IMMERSION LITHOGRAPHY

RELATED APPLICATIONS

This application is a divisional of U.S. application Ser. No. 10/994,500 filed Nov. 22, 2004 now U.S. Pat No. 7,119,035 entitled, "Method Using Specific Contact Angle for Immersion Lithography".

BACKGROUND

The present invention relates to the fabrication of substrates such as semiconductor wafers, and more specifically, to fluid-based processes such as immersion lithography for patterning one or more layers of the semiconductor substrate.

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.13 micron and even 90 nm feature sizes.

Due to the ever shrinking feature sizes, changes have been made throughout the semiconductor manufacturing process. For example, lithography is a mechanism by which a pattern on a mask is projected onto a substrate such as a semiconductor wafer. In areas such as semiconductor photolithography, it has become necessary to create images on the semiconductor wafer which incorporate minimum feature sizes under a resolution limit. Lithographic systems must use shorter light wavelengths to form the smaller features. One solution has been a process called immersion lithography. Immersion lithography uses a transparent fluid to fill the space between a projection lens of a scanning or step-and-repeat lithography system and the substrate (e.g., semiconductor wafer) surface.

For further example, in a 193-nm wavelength exposure system, it is common to use water as the fluid between the projection lens and the substrate surface. This works well because the lens can be designed with numerical apertures higher than one, which allows the lithography system to produce smaller images and thereby shrink the feature sizes.

There are a number of practical issues to implementing immersion lithography. For one, maintaining a consistent bubble-free fluid between the lens and the wafer surface is very difficult. There are basically three approaches to the problem. The first approach is to submerge the entire wafer and lens in a pool of water. The issue with this approach is that a complex system of servo motors and laser interferometers are required to accurately move the chuck, and submerging some or all of this system is difficult to achieve. The second approach is to limit the pool size to the top of the chuck. This technique would keep all of the chuck control mechanisms out of the water but would add considerable mass to the chuck that must rapidly accelerate. The third technique is to dispense the water between the lens and the wafer with a nozzle and rely on surface tension to maintain a "puddle". However, bubbles can still form between the lens and the wafer surface due to the fact that water droplets can be created all over the wafer surface, and not just at the puddle. When an unexposed portion of the wafer that includes a water droplet receives the puddle, air can be trapped, thereby causing one or more bubbles.

It is desired to provide a method for use with fabrication processes such as immersion lithography that reduces or otherwise eliminates any bubbles that may occur between on the wafer surface.

BRIEF DESCRIPTION OF THE DRAWINGS

Aspects of the present disclosure are best understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

FIGS. 3 and 4 are close-up views of water on a top surface of the semiconductor wafer of FIGS. 1 and 2.

DETAILED DESCRIPTION

Figure 1:
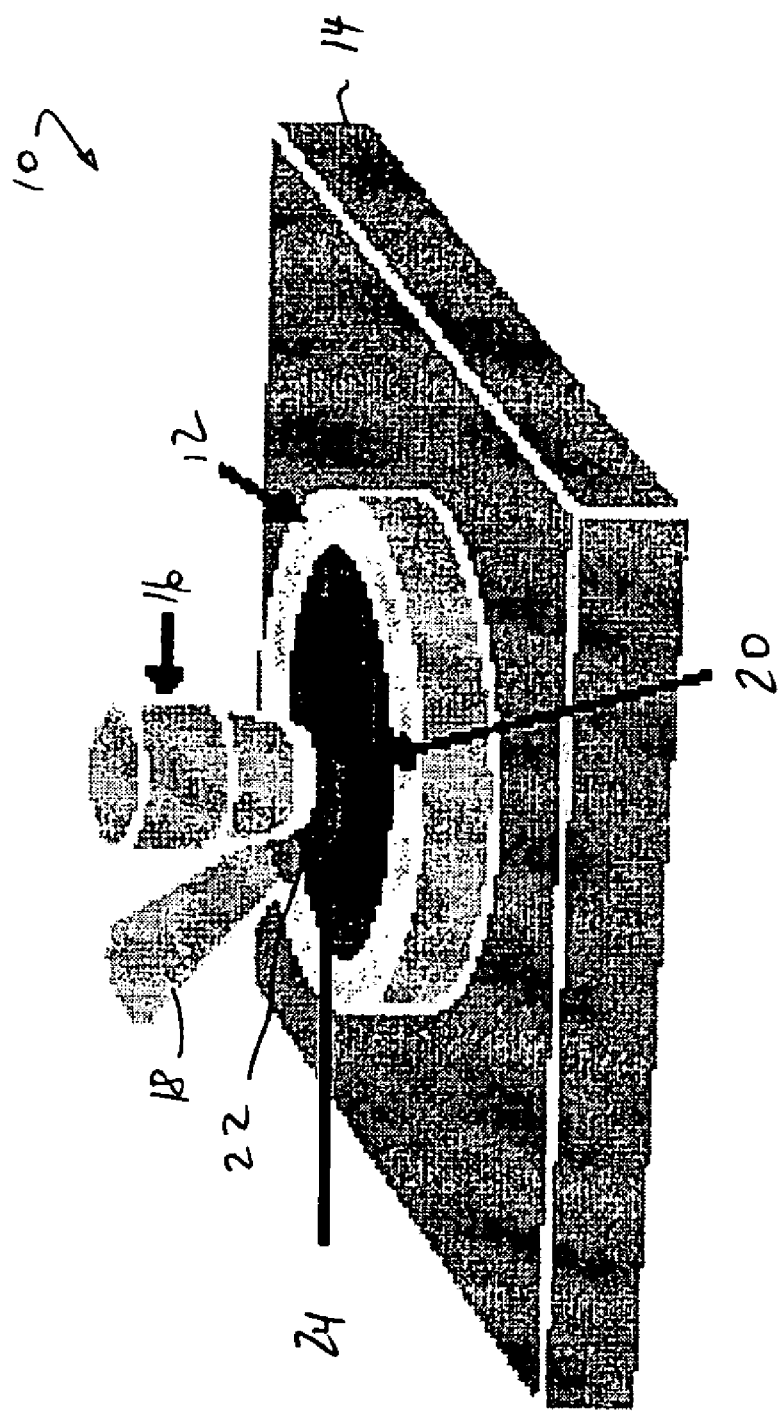
FIG. 1 is a perspective view of a semiconductor wafer being processed in an immersion lithography system according to one embodiment of the present invention.

It is to be understood that the following disclosure provides many different embodiments, or examples, for implementing different features of the present invention. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, a 193 nm immersion lithography system 10 is an example of a system and method that can benefit from different embodiments of the present invention. The immersion lithography system 10 includes a stage (or chuck) 12 and a plurality of stage control mechanisms 14, which may use such conventional devices such as servos for controlling the movement of the stage 12. The immersion lithography system 10 also includes one or more lenses 16 through which an image can be projected. In the present embodiment, the immersion lithography system 10 also includes a nozzle 18 for providing a fluid.

As shown in FIG. 1, a wafer 20 can be placed on the stage 12 and both can be moved by the stage control mechanisms 14. Also, the nozzle 18 emits water 22 to form a puddle 24 on a top surface of the wafer 20. In the present embodiment, the puddle 24 does not cover the entire top surface of the wafer 20.

In the present embodiment, the immersion lithography system 10 is a puddle-type system. The nozzle 18 dispenses the water 22 between the lens 16 and the wafer 20. Surface tension causes the water 22 to form the puddle 24. In some embodiments, the stage 12 may be recessed for receiving the wafer 20. A lip around the stage's edge allows the puddle 24 to extend off the edge of the wafer 20 during edge die exposure.

Figure 2:
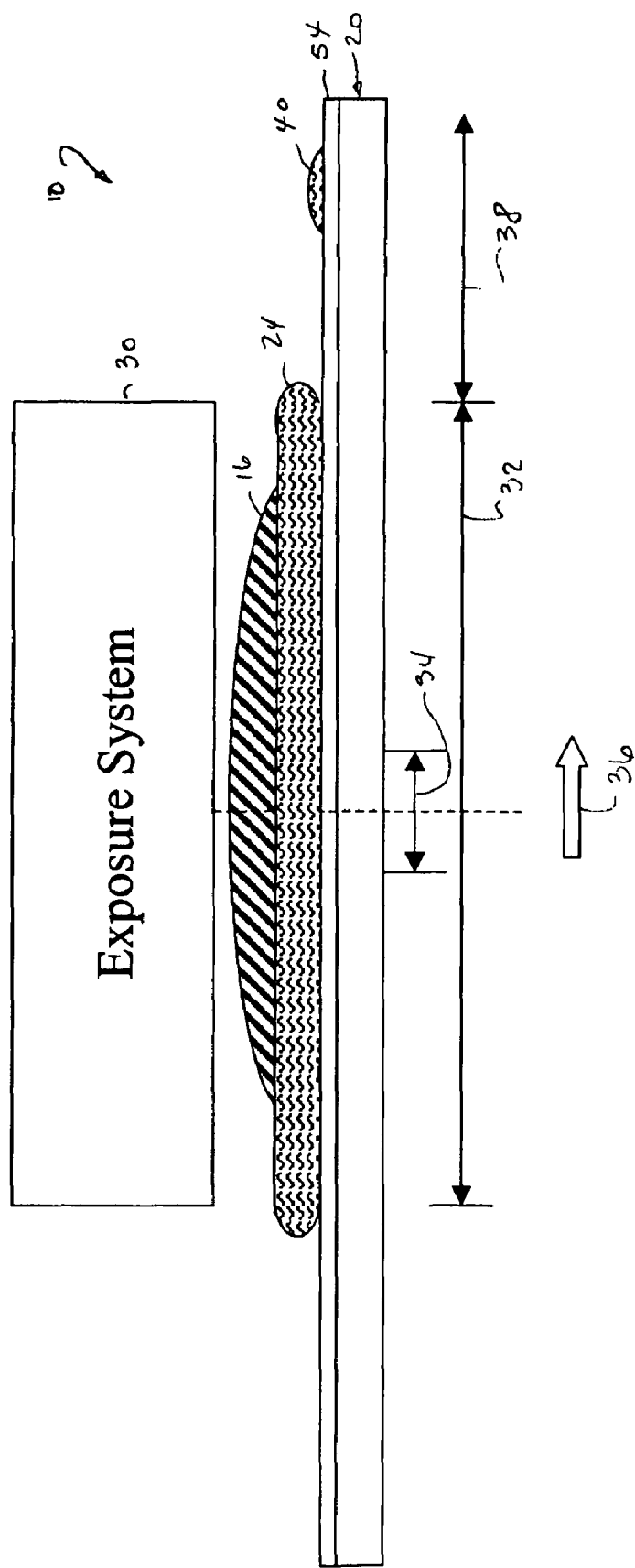
FIG. 2 is a side cross-sectional view of the semiconductor wafer and immersion lithography system of FIG. 1.

Referring also to FIG. 2, the exposure system 10 may include many additional components, including patterning devices (e.g., masks), light producing mechanisms, additional lenses and optical elements, laser measurement systems, and so forth, collectively represented by the box 30. These additional components can be dependent on various factors that are a choice of design.

The puddle 24 does not cover the entire top surface of the wafer 20, but instead covers a step area 32 that is associated with a step-and-repeat type exposure system. In one embodiment, the step area 32 may correspond to one die on the wafer. It is understood that in other embodiments, different multiples of die can be covered by a single step area 32. Furthermore, in some embodiments, a reduced exposure area 34 may be exposed to a pattern at any one time, while the step area 32 is being scanned in a direction 36 to expose an entire reticle image. Once the step area 32 has been exposed, the stage 12 moves (relatively) so that a next step area 38 can be exposed.

The stage 12 steps from location to location across the wafer 20, scanning the reticle image for each step location. In order to achieve high throughput, the stage 12 must accelerate rapidly, move accurately to the next step area, settle, scan the image and then step to the next step area all in a short period of time.

It has been noticed that on occasion, one or more water droplets 40 may appear on the top surface of the wafer 20. The water droplets 40 may be a result of overspray from the nozzle 18, may result from the scanning or stepping movement of the stage 12, or may result for some other reason.

In the example of FIG. 2, the water droplet 40 appears on the step area 38 of the wafer 20 that has not yet been exposed. When the stage 12 moves the wafer 20 so that the step area 38 is aligned to receive a new puddle, one or more air bubbles can form.

Referring now to FIGS. 3 and 4, as the puddle 24 approaches the water droplet (designated 40a and 40b in FIGS. 3 and 4, respectively), a contact angle (50a and 50b in FIGS. 3 and 4, respectively) is very important as to whether or not air is trapped between the puddle and the water droplet. In FIG. 3, the contact angle 50a of the water droplet 40a is relatively high (e.g., about 85°). As a result, a significant amount of air 52a is trapped, resulting in the creation of bubbles. In FIG. 4, the contact angle 50b of the water droplet 40b is about 60°. As a result, practically no air 52b is trapped, resulting in no bubbles. Through experimentation, it has been determined that a preferred range of contact angle is between 40° and 80°, although other angles may also be suitable.

The contact angle 50a, 50b can be controlled by the composition of a top layer 54 of the wafer 20. The top layer 54 can be various layers, such as photoresist or top antireflective layer (top ARC). It is understood that in some embodiments, a photoresist layer can be used alone for forming patterned microelectronic structures, while in other embodiments, one or more antireflective layers may be used. Furthermore, a top ARC layer is often used to prevent lens contamination. Typically, a top ARC layer is transparent to deep ultra-violet (DUV) light used in photolithography processing and has an index matched with the underlying photoresist.

The top layer 54 may include surfactants, polymers, or combinations thereof. If the top layer 54 is too hydrophobic, as is shown in FIG. 3, bubbles 52a can occur. If the top layer 54 is too hydrophilic, swelling may occur due to diffusion of the water into the hydrophilic layer (and vice versa). If swelling occurs, the results of the lithographic process will be deteriorated. Therefore, a balance between hydrophilic and hydrophobic is desired, either by treating the top layer 54, by modifying the fluid (e.g., water) 22, or both.

Monomer Ratio

To get a contact angle between hydrophilic and hydrophobic, the monomer ratio of a polymer photoresist or top ARC can be modified. The following polymers are known to be hydrophilic:

| | |
|---|---|
| poly(vinyl alcohol) | PVAL |
| poly(vinyl chloride) | PVC |
| polyamide | PA |
| poly(acrylic acid) | PAA |
| polyacrylonitrile | PAN |
| poly(ethylene oxide) | PEOX |
| poly(vinyl acetate) | PVAC |
| poly(vinyl butyral) | PVB |
| poly (p-hydroxystyrene) | PHS | as well as cellulose such as:

| | |
|---|---|
| cellulose acetate | CA |
| cellulose acetate butyrate | CAB |
| cellulose acetate propionate | CAP |
| cellulose nitrate | CN |
| cellulose propionate | CP |
| ethyl cellulose | EC |

Furthermore, common commercial hydrophilic copolymers are copolymers made of polyethylene oxide (PEO) and crystallizable polyamide, polyurethane or polyester (PBT). These materials can be used to make a hydrophobic polymer more hydrophilic. The following polymers are known to be hydrophobic:

| | |
|---|---|
| silicone | |
| polyethylene | PE |
| poly(phenylene oxide) | PPO |
| poly(phenylene sulfide) | PPS |
| polystyrene | PS |

Further still, polymers with acid labile functional group known to be hydrophobic include:
poly(4-t-butoxycarbonyloxystyrene) PBOCST Additives Additives can also be used in conjunction with, or independently of, adjusting the monomer ratio of the top layer 54. The following end groups may be added to make a hydrophobic polymer more hydrophilic:

| | |
|---|---|
| hydroxyl | OH |
| amide | CONH |
| carboxy | COOH |

In addition, additives can be added to the water 22 to make the desired contact angle.

Other Treatments

Furthermore, other treatments can be used either separately or in combination with one or more of the above-referenced treatments to achieve the desired contact angle. For example, a physical treatment such as exposing the top layer 54 to a plasma source can be used. Also, a chemical treatment of spraying the top layer 54 with an additive, such as one of the additives discussed above, can be used. Another example is to modify the polymer of the top ARC layer by using a fluorine polymer.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
   a substrate;
   a top layer disposed on the substrate, the top layer for use in an immersion lithography process and having a composition such that a liquid-filled fluid droplet that occurs during the immersion lithographic process and is not part of an exposure fluid puddle, will have a contact angle between about 40° and about 80° with a surface of the top layer inside the fluid droplet.

2. The semiconductor device of claim 1 wherein the top layer includes surfactants but not polymers.

3. The semiconductor device of claim 1 wherein the top layer includes a polymer that has been modified to be partially hydrophilic.

4. The semiconductor device of claim 3 wherein the top layer is a photoresist layer with additives to produce the contact angle between about 40° and about 80°.

5. The semiconductor device of claim 3 wherein the top layer is a photoresist layer and wherein the photoresist layer is constructed by a polymerization including a monomer ratio selected to produce the contact angle between about 40° and about 80°.

6. The semiconductor device of claim 3 wherein the top layer is a top antireflective coating with additives to produce the contact angle between about 40° and about 80°.

7. The semiconductor device of claim 3 wherein the top layer is a top antireflective coating modified with a fluorine polymer.

8. The semiconductor device of claim 3 wherein the top layer has been modified using a physical treatment to achieve the contact angle between about 40° and about 80°.

9. The semiconductor device of claim 8 wherein the physical treatment is a plasma treatment.

10. The semiconductor device of claim 3 wherein the top layer has been modified using a chemical treatment to achieve the contact angle between about 40° and about 80°.

11. The semiconductor device of claim 10 wherein the chemical treatment is a spray of additives.

12. A semiconductor device comprising:
    a semiconductor substrate;
    a top layer on the semiconductor substrate, wherein the top layer includes a composition such that a liquid droplet, that is not part of an exposure fluid puddle, will have a contact angle between about 40° and about 80° with a surface of the top layer inside the fluid droplet, and wherein the top layer includes at least one of a photoresist and an antireflective coating.

13. The semiconductor device of claim 12, wherein the fluid droplet includes water.

14. The semiconductor device of claim 12, wherein the contact angle is about 60°.

15. The semiconductor device of claim 12, wherein the liquid droplet contains no air or gas bubbles.

16. The semiconductor device of claim 12, wherein the liquid droplet is water.

* * * * *